(12) United States Patent
Lin et al.

(10) Patent No.: US 7,035,083 B2
(45) Date of Patent: Apr. 25, 2006

(54) INTERDIGITATED CAPACITOR AND METHOD FOR FABRICATION THEREOF

(75) Inventors: Wen-Chin Lin, Hsin-Chu (TW); Denny Tang, Saratoga, CA (US); Li-Shyue Lai, Jhube (TW); Chung-Long Chang, Dou-Liou (TW); Chun-Hon Chen, Jhubei (TW)

(73) Assignee: Taiwan Semiconductor Manufacturing Co Ltd, Hsin Chu (TW)

( * ) Notice: Subject to any disclaimer, the term of this patent is extended or adjusted under 35 U.S.C. 154(b) by 0 days.

(21) Appl. No.: 10/804,899

(22) Filed: Mar. 19, 2004

(65) Prior Publication Data

US 2005/0206469 A1    Sep. 22, 2005

(51) Int. Cl.
*H01G 4/06* (2006.01)

(52) U.S. Cl. .............. 361/321.1; 361/321.2; 361/301.2; 361/301.4; 361/306.1; 257/253; 257/254

(58) Field of Classification Search ........... 361/321.1, 361/321.2, 321.5, 306.1, 306.3, 303, 301.2, 361/301.4; 252/253, 254
See application file for complete search history.

(56) References Cited

U.S. PATENT DOCUMENTS

| | | | |
|---|---|---|---|
| 6,383,858 B1 | 5/2002 | Gupta et al. | |
| 6,410,954 B1 | 6/2002 | Sowlati et al. | |
| 6,417,535 B1 | 7/2002 | Johnson et al. | |
| 6,441,419 B1 * | 8/2002 | Johnson et al. | 257/296 |
| 6,496,355 B1 * | 12/2002 | Galvagni et al. | 361/306.3 |
| 6,563,191 B1 * | 5/2003 | Casey et al. | 257/296 |
| 6,730,994 B1 * | 5/2004 | Kinsman | 257/676 |
| 6,740,922 B1 * | 5/2004 | Jones et al. | 257/303 |

* cited by examiner

*Primary Examiner*—Nguyen T. Ha
(74) *Attorney, Agent, or Firm*—Tung & Associates

(57) ABSTRACT

A capacitor for use within a microelectronic product employs a first capacitor plate layer that includes a first series of horizontally separated and interconnected tines. A capacitor dielectric layer separates the first capacitor plate layer from a second capacitor plate layer. The second capacitor plate layer includes a second series of horizontally separated and interconnected tines horizontally interdigitated with the first series of horizontally separated and interconnected tines. The capacitor is formed employing a self-aligned method and the capacitor dielectric layer is formed in a serpentine shape.

16 Claims, 4 Drawing Sheets

INTERDIGITATED CAPACITOR AND METHOD FOR FABRICATION THEREOF

BACKGROUND OF THE INVENTION

1. Field of the Invention

The Invention relates generally to capacitors formed within integrated circuits. More particularly, the invention relates to capacitors with enhanced capacitance formed within integrated circuits.

2. Description of the Related Art

Capacitors find common use in integrated circuits as signal transduction components as well as data storage components. A common goal when fabricating capacitors within integrated circuits is to form capacitors with enhanced capacitance within limited semiconductor substrate surface area. Under such circumstances, integrated circuit die may often be fabricated with enhanced performance and reduced size.

Current approaches to forming higher capacitance capacitors provide multi-layer capacitor structures within minimized substrate area. While effective in providing increased capacitance, additional improvements in capacitance are nonetheless desirable. The present invention is directed towards that object.

SUMMARY OF THE INVENTION

A first object of the invention is to provide a capacitor for use within a microelectronic product.

A second object of the invention is to provide a capacitor in accord with the first object of the invention, where the capacitor is formed with enhanced capacitance.

In accord with the objects of the invention, the invention provides a capacitor for use within a microelectronic product, and a method for fabricating the capacitor.

A capacitor fabricated in accord with the invention is fabricated over a substrate. A first capacitor plate layer is formed from a first conductor layer having a first series of horizontally separated and interconnected tines that define a series of apertures interposed therebetween. A capacitor dielectric layer is formed upon the first conductor layer without completely filling the series of apertures. A second conductor layer is formed upon the capacitor dielectric layer and completely filling the series of apertures interposed between the first series of tines. The second conductor layer may be partially or completely planarized to form a second capacitor plate layer with a second series of tines horizontally interdigitated with the first series of tines.

The invention provides a capacitor with enhanced capacitance for use within a microelectronic product.

The invention realizes the foregoing object by forming the capacitor with a first capacitor plate layer having a first series of interconnected tines such that a second series of tines within a second capacitor plate layer may be horizontally interdigitated with the first series of tines.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a capacitor with enhanced capacitance for use within a microelectronic product.

The invention realizes the foregoing object by forming the capacitor with a first capacitor plate layer having a first series of interconnected tines such that a second series of tines within a second capacitor plate layer may be horizontally interdigitated with the first series of tines.

FIG. 1 to FIG. 5 show a series of schematic cross-sectional diagrams illustrating the results of progressive stages in fabricating a microelectronic product in accord with a first preferred embodiment of the invention.

Figure 1:
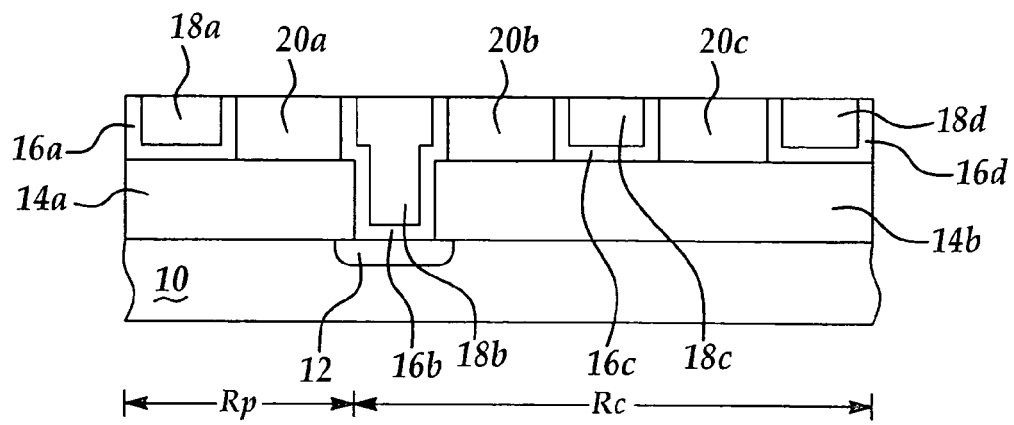
FIG. 1, FIG. 2, FIG. 3, FIG. 4 and FIG. 5 show a series of schematic cross-sectional diagrams illustrating the results of progressive stages in fabricating a capacitor structure in accord with a first preferred embodiment of the invention.

FIG. 1 first shows a substrate 10 having a contact region 12 formed therein.

The substrate 10 may comprise any of several types of substrates conventionally employed within microelectronic products. Such substrates may include but are not limited to semiconductor substrates and ceramic substrates. Representative semiconductor substrates include bulk silicon semiconductor substrates, bulk silicon-germanium alloy semiconductor substrates and semiconductor-on-insulator semiconductor substrates. Typically, the substrate 10 includes a semiconductor substrate having a dielectric surface layer laminated thereover.

The contact region 12 may be either a conductor contact region or a semiconductor contact region depending upon the layered nature of the substrate 10.

A pair of patterned first dielectric layers 14a and 14b is formed upon the substrate 10 and defining a first aperture that accesses the contact region 12. The pair of patterned first dielectric layers 14a and 14b may be formed from any of several dielectric materials, including generally higher dielectric constant dielectric materials (having a dielectric constant of from about 4 to about 8, such as silicon oxide, silicon nitride and silicon oxynitride dielectric materials) and generally lower dielectric constant dielectric materials (having a dielectric constant of less than about 4, such as spin-on-glass (SOG), spin-on-polymer (SOP), amorphous carbon and fluorosilicate glass (FSG) dielectric materials). Typically, each of the pair of patterned first dielectric layers 14a and 14b is formed to a thickness of from about 4000 to about 8000 angstroms.

Finally, FIG. 1 shows a series of series of patterned first conductor layers 18a, 18b, 18c and 18d nested within a series of patterned first barrier layers 16a, 16b, 16c and 16d, in turn separated by a series of patterned second dielectric layers 20a, 20b and 20c.

The series of patterned dielectric layers 20a, 20b and 20c may in general be formed of dielectric materials analogous, to the dielectric materials that are employed for forming the pair of patterned first dielectric layers 14a and 14b. For reasons that will become clearer below, they are not formed of identical dielectric materials. Each of the series of patterned second dielectric layers 20a, 20b and 20c is typically formed to a thickness of from about 4000 to about 8000 angstroms. The series patterned first conductor layers 18a, 18b, 18c and 18d is typically formed of a copper or copper alloy conductor material. The series of patterned first barrier layers 16a, 16b, 16c and 16d is typically formed from any of several barrier materials appropriate for inhibiting interdiffusion of the series of patterned first conductor layers 18a, 18b, 18c and 18d with the series of patterned first dielectric layers 20a, 20b and 20c. Such barrier materials may include, but are not limited to titanium barrier materials, tungsten barrier materials and nitride alloys thereof. Typically, each of the series of patterned barrier layers 16a, 16b, 16c and 16d is formed to a thickness of from about 200 to about 500 angstroms. As is illustrated in FIG. 1, the patterned barrier layer 16b and the patterned first conductor layer 18b connect to the contact region 12.

FIG. 1 implicitly illustrates a microelectronic product having a series of patterned conductor layers formed employing a planarizing method and separated by a series of patterned dielectric layers. The invention is not so limited. Directly patterned conductor layers may also be employed within the invention. Aluminum containing conductor materials are often directly patterned while employing plasma etch methods. Copper containing conductor materials are typically not readily plasma etchable, thus requiring planarizing methods.

FIG. 1 finally shows the substrate 10 as divided into a peripheral region Rp and a capacitor region Rc. A capacitor in accord with the invention will be formed within the capacitor region Rc.

Figure 2:
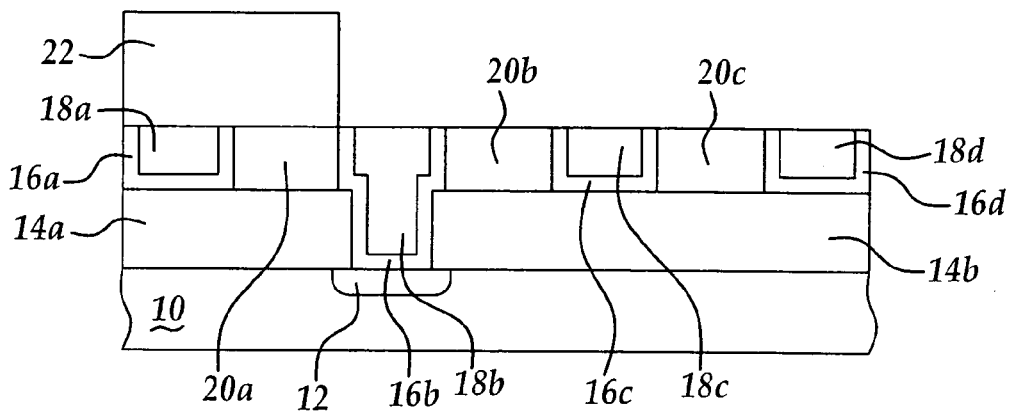

FIG. 2 shows the results of forming a patterned photoresist layer 22 upon the patterned barrier layer 16a, the patterned conductor layer 18a and patterned dielectric layer 20a, thus covering the peripheral region Rp of the substrate 10 but not the capacitor region Rc of the substrate 10. The patterned photoresist layer 22 may be formed of positive photoresist materials or negative photoresist materials. Typically, the patterned photoresist layer 22 is formed to a thickness of from about 10000 to about 20000 angstroms.

Figure 3:
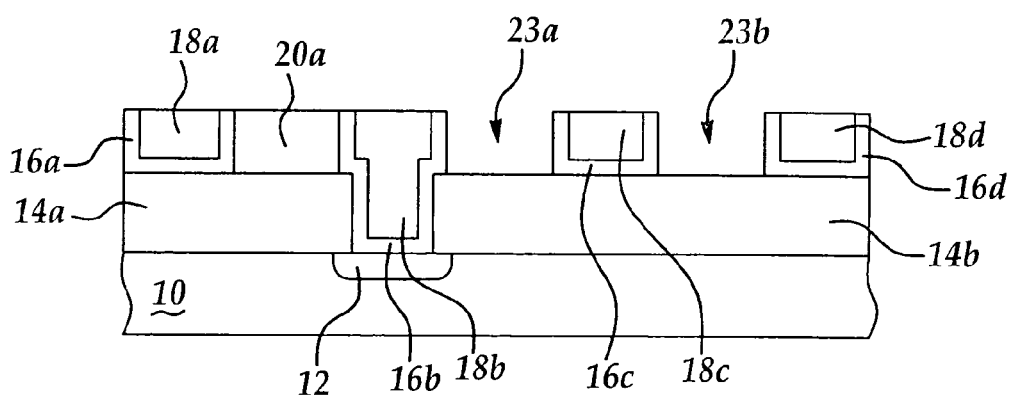

FIG. 3 first shows the results of stripping the pair of patterned dielectric layers 20b and 20c from interposed between the series of patterned conductor layers 18b, 18c and 18d to form a pair of second apertures 23a and 23b. FIG. 3 next shows the results of stripping the patterned photoresist layer 22 from upon the patterned barrier layer 16a, the patterned conductor layer 18a and the patterned dielectric layer 20a.

The foregoing sequential stripping may be effected employing etchants as are conventional in the microelectronic product fabrication art. A hydrofluoric acid based etchant may be employed to strip the pair of patterned second dielectric layers 20b and 20c when formed of a silicon oxide based dielectric material. The patterned photoresist layer 22 may be stripped employing wet chemical and/or dry plasma strippers.

Figure 4:
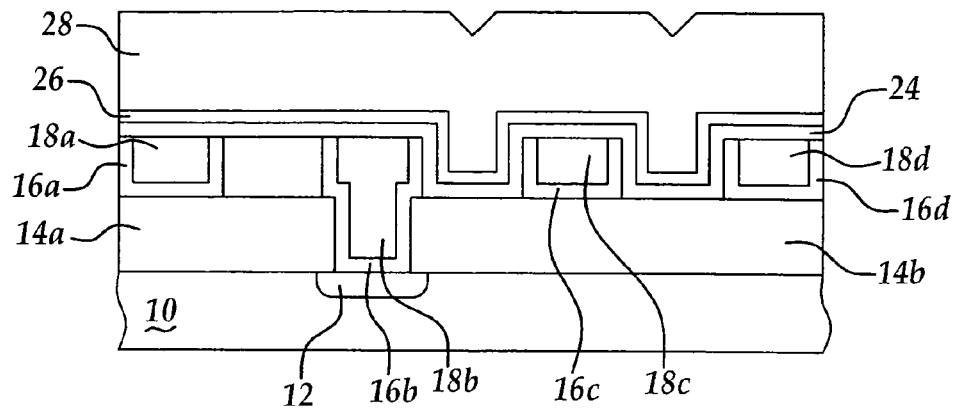

FIG. 4 shows the results of successively layering: (1) a blanket capacitor dielectric layer 24; (2) a blanket second barrier layer 26; and (3) a blanket second conductor layer 28 upon the microelectronic product of FIG. 3. The blanket capacitor dielectric layer 24 incompletely fills the pair of second apertures 23a and 23b, while the blanket second conductor layer 28 completely fills the pair of second apertures 23a and 23b.

The blanket capacitor dielectric layer 24 may be formed of capacitor dielectric materials as are conventional in the microelectronic product fabrication art. They may include generally lower dielectric constant capacitor dielectric materials (i.e., having a dielectric constant less that about 8, such as silicon oxide, silicon nitride and silicon oxynitride dielectric materials) and generally higher dielectric constant capacitor dielectric materials (i.e., having a dielectric constant of greater than about 8, such as lead zirconate titanate and barium strontium titanate dielectric materials). The blanket capacitor dielectric layer 24 is typically formed to a thickness of from about 20 to about 200 angstroms. The blanket second barrier layer 26 may be formed of materials and dimensions analogous, equivalent or identical to the materials and dimensions employed for forming the series of patterned first barrier layers 16a, 16b, 16c and 16d. The blanket second conductor layer 28 may be formed of materials and dimensions analogous, equivalent or identical to the materials and dimensions employed for forming the series of patterned first conductor layers 18a, 18b, 18c and 18d.

Figure 5:
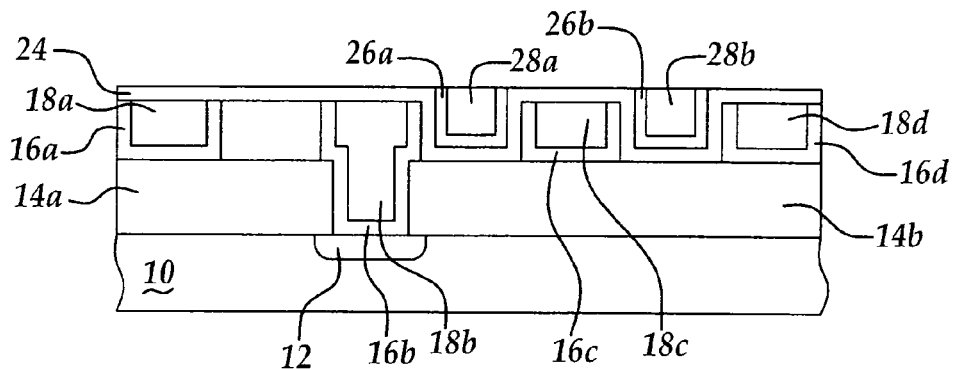

FIG. 5 shows the results of planarizing the microelectronic product of FIG. 4 while employing the blanket capacitor dielectric layer 24 as a planarizing stop layer. The planarizing provides a pair of patterned second conductor layers 28a and 28b nested within a pair of patterned second barrier layers 26a and 26b formed within the pair of second apertures 23a and 23b.

Figure 6:
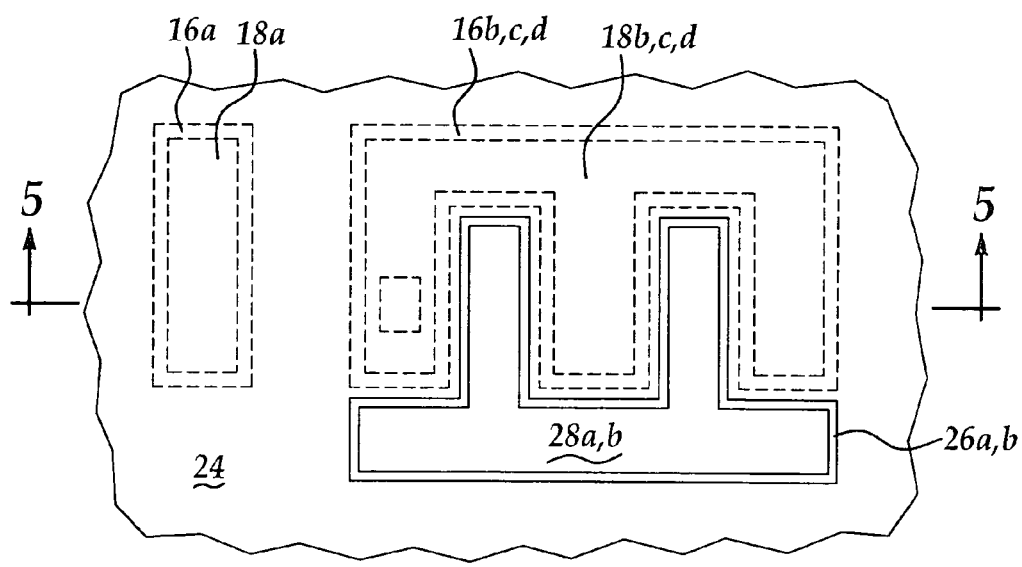
FIG. 6 shows a schematic plan-view diagram corresponding with FIG. 5.

FIG. 6 shows a schematic plan-view diagram of the microelectronic product of FIG. 5.

FIG. 6 shows a patterned second conductor layer 28a/b nested within a patterned second barrier layer 26a/b in turn planarized within the blanket capacitor dielectric layer 24. Shown in phantom outline beneath the blanket capacitor dielectric layer 24 is the patterned first conductor layer 18a nested within the patterned first barrier layer 16a. Also shown in phantom is the patterned first conductor layer 18b/c/d nested within the patterned first barrier layer 16b/c/d. As is illustrated within FIG. 5 and FIG. 6, the patterned first conductor layer 18b/c/d is formed in the shape of a comb with the series of tines 18b, 18c and 18d horizontally separated by the pair of second apertures 23a and 23b. The patterned second conductor layer 28a/b fills the pair of second apertures 23a and 23b and provides a pair of second tines horizontally (and not vertically) interdigitated with the series of first tines.

As illustrated in FIG. 5 and FIG. 6, a capacitor in accord with the invention is formed employing a self aligned planarizing method for forming a patterned first capacitor plate layer 28a/b with respect to a patterned second capacitor plate layer 18b/c/d. Under circumstances where the pair of second apertures 23a and 23b as illustrated in FIG. 3 is formed with a minimum photolithographically resolvable linewidth, a patterned second conductor layer 28a or 28b is formed with less than a minimum photolithographically resolvable linewidth. In addition, the invention also provides direct thickness control when depositing a capacitor dielectric layer. In light of the foregoing features, the invention provides a capacitor with enhanced capacitance within a reduced substrate area.

The invention also provides a characteristic serpentine shaped contiguous capacitor dielectric layer 24. It is formed in sequence: (1) covering a top surface of a patterned first conductor layer; (2) interposed between a pair of opposing sidewalls of the patterned first conductor layer and a patterned second conductor layer; (3) beneath a bottom surface of the patterned second conductor layer; and (4) interposed between a pair of opposing sidewalls of the patterned second conductor layer and an additional patterned first conductor layer.

FIG. 7 to FIG. 11 show a series of schematic cross-sectional diagrams illustrating the results of progressive stages in forming a microelectronic product in accord with a second preferred embodiment of the invention.

Figure 7:
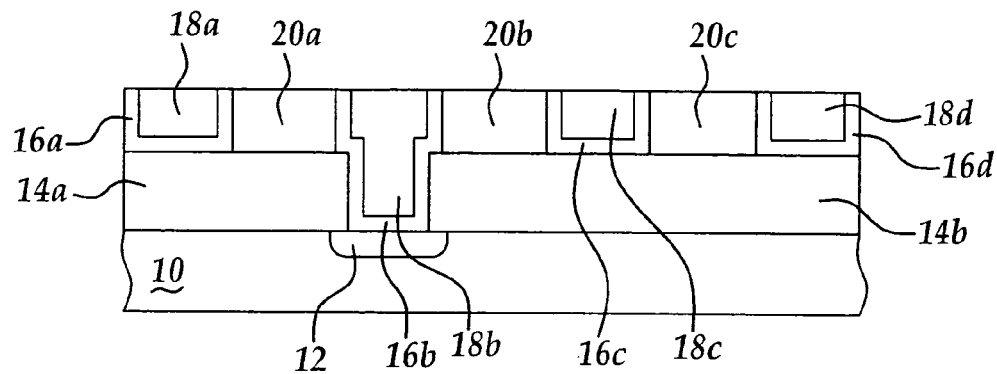
FIG. 7, FIG. 8, FIG. 9, FIG. 10 and FIG. 11 show a series of schematic cross-sectional diagrams illustrating the results of progressive stages in fabricating a capacitor structure in accord with a second preferred embodiment of the invention.

FIG. 7 is identical with FIG. 1. Identical layers and identical structures are numbered identically.

Figure 8:
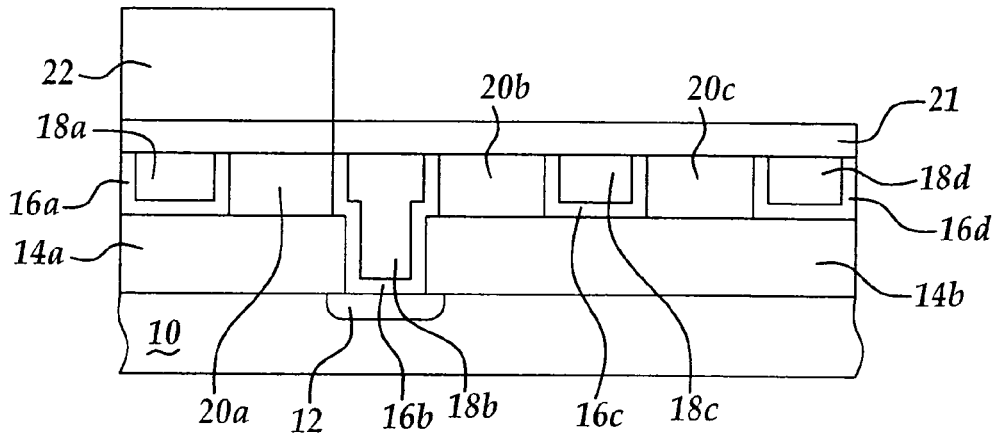

FIG. 8 corresponds with FIG. 2, but with the addition of a blanket extrinsic planarizing stop layer 21 formed upon the microelectronic product of FIG. 7 and beneath the patterned photoresist layer 22. Otherwise, identical layers and identical structures are numbered identically.

Figure 9:
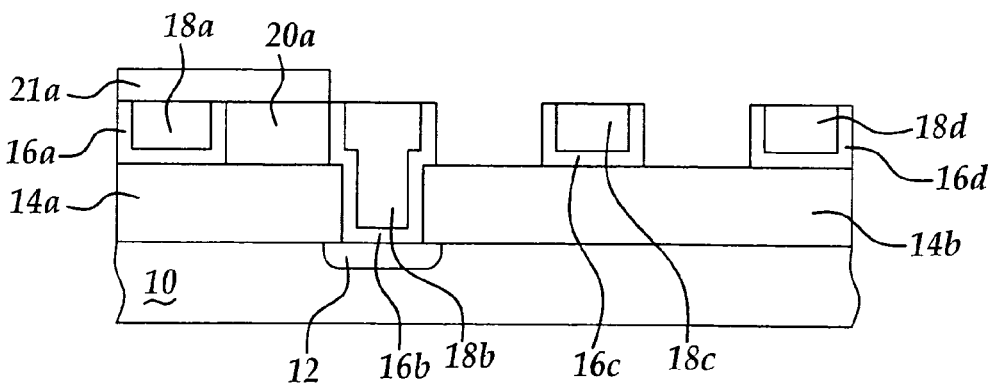

FIG. 9 corresponds with FIG. 3, but with the addition of a patterned extrinsic planarizing stop layer 21a covering the patterned first barrier layer 16a, the patterned first conductor layer 18a and the patterned second dielectric layer 20a. Otherwise, identical layers and identical structures are numbered identically.

Figure 10:
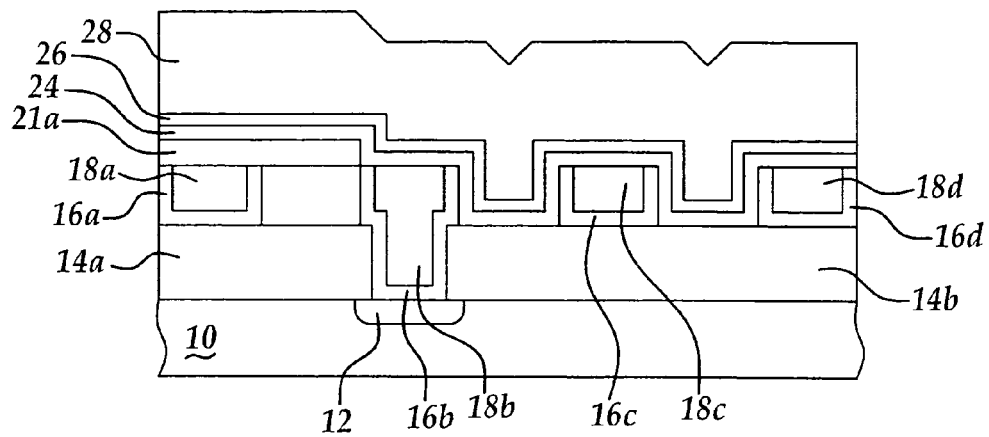

FIG. 10 corresponds with FIG. 4, but also with the addition of a patterned extrinsic planarizing stop layer 21a covering the patterned first barrier layer 16a, the patterned first conductor layer 18a and the patterned second dielectric layer 20a. Otherwise, identical layers and identical structures are numbered identically.

Figure 11:
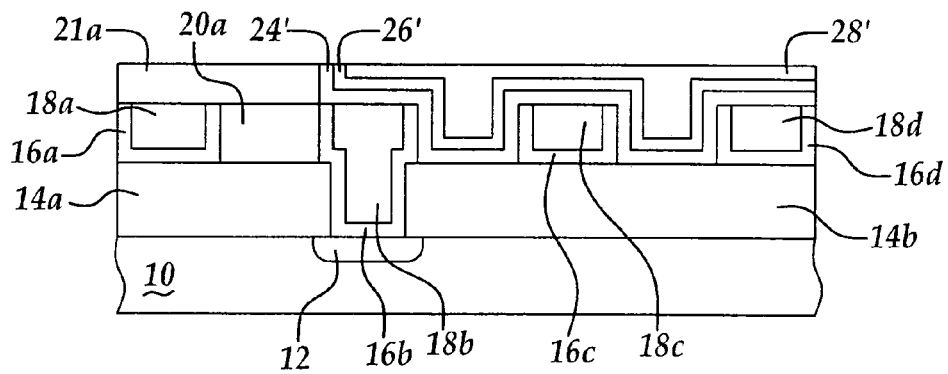

FIG. 11 corresponds with FIG. 5, but illustrates an incomplete planarization of the blanket second conductor layer 28 over the capacitor region Rc to form an incompletely planarized second conductor layer 28' upon an incompletely planarized second barrier layer 26' upon an incompletely planarized capacitor dielectric layer 24'. In addition to completely filling the pair of second apertures 23a and 23b, the incompletely planarized second conductor layer 28' also covers top portions of the series of patterned first conductor layers 18b, 18c and 18d, thus providing for enhanced capacitance.

Figure 12:
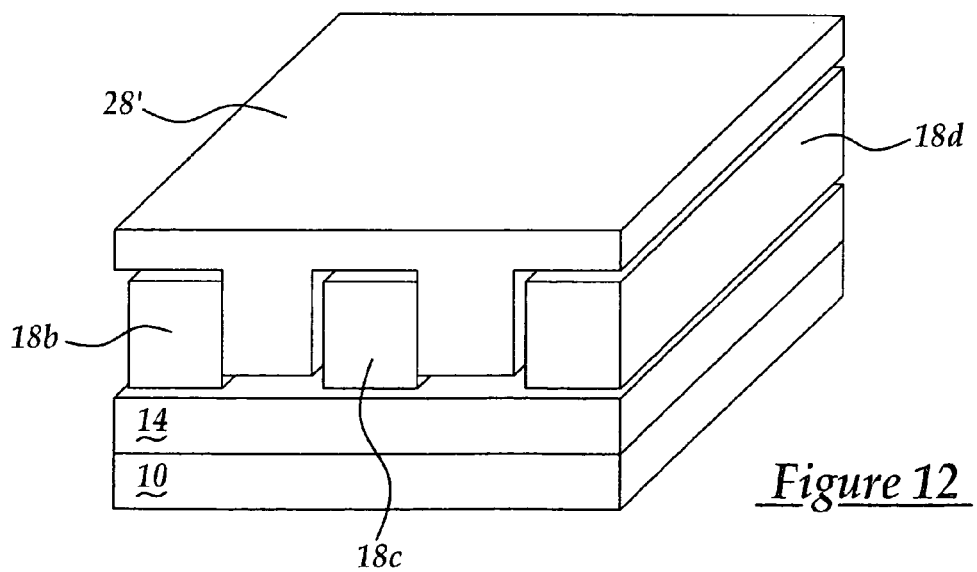
FIG. 12 shows a schematic perspective-view diagram corresponding with FIG. 11.

FIG. 12 shows a partially exploded schematic perspective-view diagram of FIG. 11. Absent is the peripheral region of the substrate 10, the partially planarized barrier layer 26' and the partially planarized capacitor dielectric layer 24'. FIG. 12 clearly shows the partially planarized second conductor layer 28' that serves as a second capacitor plate horizontally and not vertically interdigitated with and covering a series of top surfaces of the series of patterned first conductor layers 18b, 18c and 18d.

The preferred embodiment of the invention is illustrative of the invention rather than limiting of the invention. Revisions and modifications may be made to methods, materials structures and dimensions in accord with the preferred embodiments of the invention, while still providing a microelectronic product in accord with the invention, further in accord with the accompanying claims.

What is claimed is:

1. A capacitor comprising:
    a substrate;
    a first capacitor plate layer disposed over the substrate, the first capacitor plate layer comprising a horizontally separated and contiguously interconnected first series of tines disposed on a dielectric layer;
    a second capacitor plate layer separated from the first capacitor plate layer by a contiguous serpentine shaped capacitor dielectric layer, the second capacitor plate layer comprising a horizontally separated and contiguously interconnected second series of tines, said second series of tines horizontally interdigitated between the first series of tines.

2. The capacitor of claim 1 wherein the second series of tines is horizontally interdigitated but not vertically interdigitated with respect to the first series of tines.

3. The capacitor of claim 1 wherein the substrate is a semiconductor substrate.

4. The capacitor of claim 1 wherein the substrate is a ceramic substrate.

5. The capacitor of claim 1 wherein the capacitor dielectric layer is formed to a thickness of from about 20 to about 200 angstroms.

6. The capacitor of claim 1 wherein the second capacitor plate also covered series of top surfaces of the first series of tines.

7. The capacitor of claim 1 wherein the second series of tines is self-aligned with respect to the first series of tines.

8. The capacitor of claim 1 wherein where the first series of tines is contiguously interconnected according to a base portion of said first series of tines, said base portion and said first series tines comprising a comb shape structure extending parallel to the horizontal plane of the substrate.

9. The capacitor of claim 1 wherein the second series of tines is contiguously interconnected according to a base portion of said second series of tines, said base portion and said second series tines comprising a comb shape structure extending parallel to the horizontal plane of the substrate.

10. The capacitor of claim 9 wherein the second series of tines is further contiguously interconnected according to an upper conductive portion disposed over the top surface of said first series of tines.

11. The capacitor of claim 1 wherein the first series of tines is encapsulated on bottom and sidewall portions.

12. The capacitor of claim 1 wherein the first series of tines is encapsulated by a barrier layer on bottom and sidewall portions.

13. The capacitor of claim 12 wherein the second series of tines including the upper conductive portion is encapsulated by a contiguous barrier layer on bottom and sidewall portions.

14. The capacitor of claim 1 wherein the second series of tines is encapsulated by a contiguous barrier layer on bottom and sidewall portions.

15. A capacitor comprising:
    a substrate with an overlying dielectric layer;
    a comb shaped first capacitor plate disposed on the dielectric layer, said first capacitor plate layer comprising a first series of tines extending parallel to the substrate and contiguously interconnected at a base portion; and,
    a comb shaped second capacitor plate layer separated from the first capacitor plate layer by a contiguous serpentine shaped capacitor dielectric layer, said second capacitor plate layer comprising a second series of lines extending parallel to the substrate and contiguously interconnected at a base portion, said second series of tines horizontally interdigitated between the first series of tines.

16. A capacitor comprising:
    a substrate with an overlying dielectric layer;
    a comb shaped first capacitor plate disposed on the dielectric layer, said first capacitor plate layer comprising a first series of tines extending parallel to the substrate and contiguously interconnected at a base portion;
    a comb shaped second capacitor plate layer separated from the first capacitor plate layer by a contiguous serpentine shaped capacitor dielectric layer, second capacitor plate layer comprising a second series of time extending parallel to the substrate and contiguously interconnected at a base portion, said second series of Lines horizontally interdigitated between the first series of lines; and,
    wherein the second series of tine is further contiguously interconnected over a top surface of said second series of tines.

* * * * *